United States Patent
Cho et al.

(10) Patent No.: US 7,482,230 B2
(45) Date of Patent: Jan. 27, 2009

(54) RECESS CHANNEL TRANSISTOR FOR PREVENTING DETERIORATION OF DEVICE CHARACTERISTICS DUE TO MISALIGNMENT OF GATE LAYERS AND METHOD OF FORMING THE SAME

(75) Inventors: Gyu Seog Cho, Kyoungki-do (KR); Yong Taik Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/020,686

(22) Filed: Jan. 28, 2008

(65) Prior Publication Data

US 2008/0138952 A1 Jun. 12, 2008

Related U.S. Application Data

(62) Division of application No. 11/299,544, filed on Dec. 12, 2005, now abandoned.

(30) Foreign Application Priority Data

Oct. 25, 2005 (KR) .................. 10-2005-0100835

(51) Int. Cl.
*H01L 21/335* (2006.01)
(52) U.S. Cl. .................. 438/270; 438/282; 438/700
(58) Field of Classification Search .......... 438/270, 438/282, 700
See application file for complete search history.

(56) References Cited

U.S. PATENT DOCUMENTS

| 6,452,229 | B1 * | 9/2002 | Krivokapic .................. 257/330 |
| 6,509,234 | B1 * | 1/2003 | Krivokapic .................. 438/270 |
| 7,326,619 | B2 * | 2/2008 | Park et al. .................. 438/282 |
| 2005/0020086 | A1 * | 1/2005 | Kim et al. .................. 438/700 |
| 2005/0042833 | A1 * | 2/2005 | Park et al. .................. 438/282 |
| 2005/0212038 | A1 * | 9/2005 | Fujiwara .................. 257/330 |
| 2007/0057318 | A1 * | 3/2007 | Bach et al. .................. 257/324 |
| 2007/0090452 | A1 * | 4/2007 | Cho et al. .................. 257/330 |
| 2008/0090356 | A1 * | 4/2008 | Park et al. .................. 438/270 |
| 2008/0138952 | A1 * | 6/2008 | Cho et al. .................. 438/270 |

FOREIGN PATENT DOCUMENTS

KR 1020050068910 A * 5/2005

\* cited by examiner

*Primary Examiner*—Laura M Menz
(74) *Attorney, Agent, or Firm*—Ladas & Parry LLP

(57) ABSTRACT

The recess channel transistor includes: a semiconductor substrate including a device insulation layer defining an activation region in which recesses are formed; insulation buffer patterns, each of which is formed at an opening of the recess on a surface of the substrate; gates, each of which includes a recess gate formed in the recess and a top gate formed on the substrate; spacers, each of which is formed at both sides of the gate; and a source region and a drain region formed at both sides of each gate on the surface of the substrate, where the source and drain regions have an even doping profile due to the existence of insulation buffer patterns. Accordingly, characteristics of the transistor can be prevented from deteriorating due to misalignment of the top gate with the recess gate.

14 Claims, 7 Drawing Sheets

RECESS CHANNEL TRANSISTOR FOR PREVENTING DETERIORATION OF DEVICE CHARACTERISTICS DUE TO MISALIGNMENT OF GATE LAYERS AND METHOD OF FORMING THE SAME

BACKGROUND OF THE INVENTION

1. Field of the Invention

The present invention relates generally to a recess channel transistor, and more particularly to a recess channel transistor and a method of forming the same, which can prevent deterioration of transistor characteristics due to misalignment between a recess gate and a top gate on the recess gate.

2. Description of the Prior Art

Recently, as the design rule for currently developing semiconductor memory devices reduces the device sizes below sub-100 nm, it has become very difficult to secure sufficient data retention time. When the minimum feature size is reduced, doping density in a substrate must be increased. Thus, if the doping density in the substrate becomes higher, the electric field and the junction leakage must also increase. Therefore, in order to realize a target threshold voltage Vt required by a certain semiconductor memory device, a transistor having an existing planar structure faces a limitation in view of processing and device characteristics.

Accordingly, a recess channel transistor structure extending the channel length has been proposed as a method for decreasing the substrate doping density. Such a recess channel transistor can reduce the substrate doping density, thereby extending the data retention time. Further, such a recess channel transistor can lower the electric field, thereby making it possible to obtain an excellent refreshing characteristic. In addition, as the channel length increases, it is possible to improve characteristics of DIBL and BVds, resulting in the improvement of cell characteristics.

Hereinafter, a conventional method for forming a recess channel transistor, which had been previously proposed, will be described in brief.

First, a recess mask is formed on a semiconductor substrate to expose an activation region in which gates are formed. Then, the exposed activation region of the substrate is etched so as to form recesses. Next, after the recess mask is removed, a gate insulation layer is formed on a bottom surface of each recess. Sequentially, after a gate conductive layer is formed on a whole surface of the substrate in order to fill in the recesses, a hard mask layer is formed on the gate conductive layer.

In turn, the hard mask layer and the gate conductive layer are etched so as to form a gate in each recess. Next, after a Lightly Doped Drain (LDD) ion implant process is performed on the resultant of the substrate, a spacer is formed at both side walls of each gate. Then, source/drain regions are formed at both sides of each gate, including the spacer on the surface of the substrate, thereby establishing the formation of the recess channel transistor.

In the recess channel transistor formed by the method described above, it is important that the two transistors which are formed in a cell have the same shapes. Thus, the gate formed in the recess must be accurately aligned with the top gate integrated with the recess gate.

However, it is substantially difficult to control the alignment of the recess gate with the top gate. Thus, the misalignment of the recess gate with the top gate may occur. It causes a change in the characteristics of the transistor, which thereby fails to obtain desired cell characteristics.

FIG. 1 is a cross-sectional view for illustrating a conventional recess channel transistor. Problems in the conventional transistor will be described in brief.

As shown in FIG. 1, various factors relating to the processes cause the misalignment of the recess gate 104a with the top gate 104b to be integrated with the recess gate. In this case, in view of a storage node, a left transistor differs structurally from a right transistor. This causes both transistors to have different threshold voltage Vt. Thus, the difference in the threshold voltage Vt between both transistors causes a tWR characteristic to be weak when a cell has a relatively high threshold voltage, while causing an Ioff characteristic to be weak when the cell has a relatively low threshold voltage. As a result, it is difficult to store data in the cell.

Further, the misalignment of the recess gate 104a with the top gate 104b causes the recess gate 104a to be subjected to etching damages. Thus, the gate insulation layer 103 at the channel becomes thick, thereby abnormally increasing the threshold voltage so that tREF/tWR characteristics deteriorate.

In FIG. 1, a reference numeral "101" denotes a semiconductor substrate, a reference numeral "102" indicates a device insulation layer, and a reference numeral "105" denotes a hard mask layer. Further, reference numerals "106", "107", and "108" respectively indicate a spacer, a source region in contact with a storage nod, and a drain region in contact with a bit line.

SUMMARY OF THE INVENTION

Accordingly, the present invention has been developed in order to solve the above-mentioned problems occurring in the prior art, and an object of the present invention is to provide a recess channel transistor and a method for forming the same, which can prevent characteristic of the transistor from deteriorating due to misalignment between a recess gate and a top gate which is arranged on the recess gate.

In order to accomplish the object of the present invention, according to an aspect of the present invention, there is provided a recess channel transistor which comprises: a semiconductor substrate including a device insulation layer defining an activation region in which recesses are formed, gates being formed in the recesses respectively; insulation buffer patterns, each of which is formed at an opening of the recess on a surface of the substrate; gates, each of which includes a recess gate which is formed in the recess and a top gate which is formed on the substrate including the recess gates; spacers, each of which is formed at both sides of the gate; and a source region and a drain region formed at both sides of each gate on the surface of the substrate including the spacer, wherein the source and drain regions have even doping profile due to the existence of insulation buffer patterns.

Here, the insulation buffer patterns are respectively made of a nitride layer or a nitric oxide layer. In addition, the insulation buffer patterns are formed at a depth of 100~300 Å on the surface of the substrate and at a width of 50~500 Å on a side wall of the recess. The recess gates are formed at a depth of 500~1000 Å.

In order to accomplish the object of the present invention, according to another aspect of the present invention, there is provided a method for forming a recess channel transistor, which comprises the steps of: preparing a semiconductor substrate having an activation region and a device insulation region; etching gate forming portions in the activation region of the substrate, so as to form first recesses; etching the device insulation region, so as to form is trenches; filling the trenches and the first recesses with an insulation layer; etching center portions of the insulation layer filled in the first recesses and the substrate under the insulation layer, so as to make second recesses deeper than the first recesses and to form the insulation buffer patterns at an opening of the second recesses; forming a gate insulation layer on an inner wall of the second recesses and a surface of the substrate; forming a gate conductive layer on the whole surface of the substrate in order to fill in the second recesses; etching the gate conductive layer, so as to form the gates including the recess gates disposed in the second recesses and the top gates disposed on the recess gates; forming spacers at both sidewalls of each gate; and performing source/drain ion implant on the resultant of the substrate, so as to form a source region and a drain region at both sides of the gates in the surface of the substrate including the spacers, wherein the source and drain regions have an even doping profile due to an existence of insulation buffer patterns.

The first recesses are formed at a depth of 100~300 Å. The second recesses are formed at a depth of 500~1000 Å. The insulation buffer patterns are formed of a nitride layer or a nitric oxide layer, which are formed at a depth of 100~300 Å in the surface of the substrate and at a width of 50~500 Å on the inner surface of the second recesses.

The method of the present invention further comprises the steps of: forming a hard mask layer on the gate conductive layer; and etching the hard mask layer, after forming the gate conductive layer and before etching the gate conductive layer.

In order to accomplish the object of the present invention, according to still another aspect of the present invention, there is provided a method for forming a recess channel transistor, which comprises the steps of: preparing a semiconductor substrate including a device insulation layer defining an activation region; etching a gate forming portion in the activation region of the substrate, so as to form first recesses; forming an insulation layer on a whole surface of the substrate including the first recesses; etching the insulation layer in blanket manner, so as to form insulation buffer patterns on a side wall of the first recesses; etching a bottom surface of the first recesses having no insulation buffer pattern, so as to make second recesses deeper than the first recesses; forming a gate insulation layer on a surface of the second recesses and the surface of the substrate; forming a gate conductive layer on the whole surface of the substrate so that the second recesses including the gate insulation layer are filled with the gate conductive layer; etching the gate conductive layer, so as to form gates including recess gates disposed in the second recesses and top gates disposed on the recess gates; forming spacers at both sides of the gates; and performing source/drain ion implant on the resultant of the substrate, so as to form source and drain regions at both sides of each gate on the surface of the substrate including the spacers, wherein the source and drain regions have an even doping profile due to the existence of insulation buffer patterns.

Here, the first recesses are formed at a depth of 100~300 Å. The insulation buffer patterns are formed of a nitride layer or a nitric oxide layer. The insulation buffer patterns are formed at a depth of 100~300 Å in the surface of the substrate and at a width of 50~500 Å on the inner surface of the second recesses. The second recesses are formed at a depth of 500~1000 Å.

The method of the present invention further comprises the steps of: forming a hard mask layer on the gate conductive layer; and etching the hard mask layer, after forming the gate conductive layer and before etching the gate conductive layer.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

First, the technical principles of the present invention will be described. In the present invention, insulation buffer patterns are formed at an upper region of recess gates, which have a relatively large effect on threshold voltage. Therefore, the insulation buffer patterns can remove the most weak portion having an effect on the threshold voltage, thereby forming a doping profile in the source/drain regions. Although misalignment of the recess gates with the top gates occurs, it is possible to restrain characteristic changes of a transistor.

In addition, if the insulation buffer patterns are formed at both sides of an upper end of the recess gates, the insulation buffer patterns can protect the recess gates from etching damage even though the misalignment of the recess gates with the top gates occurs. Thus, it is possible to protect the recess gates against deterioration of characteristics, i.e. tREF/tWR, caused by the etching damage.

FIGS. 2A through 2F are cross-sectional views for illustrating the method of forming a recess channel transistor according to an embodiment of the present invention.

Figure 1:
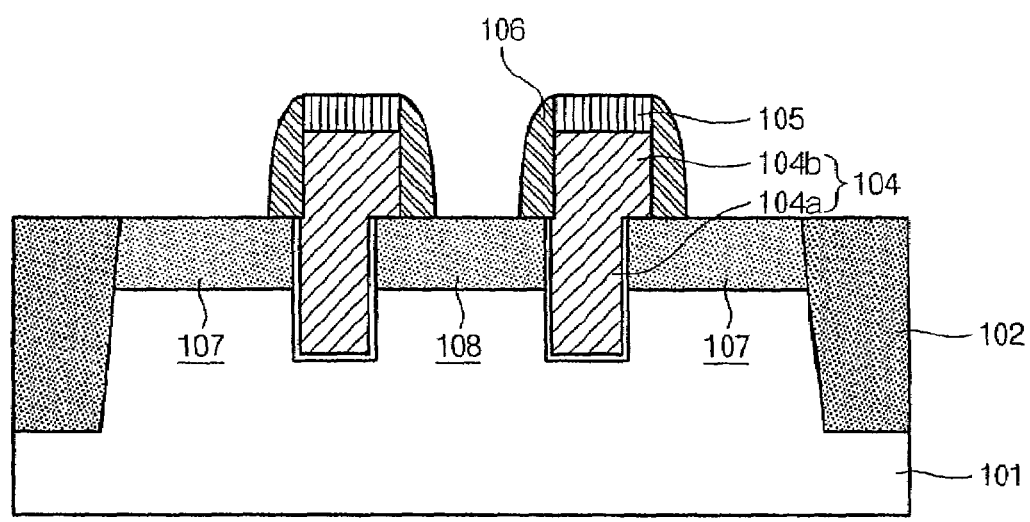
FIG. 1 is a cross-sectional view showing a conventional recess channel transistor, which illustrates a misalignment between a recess gate and a top gate.
Figure 2A:
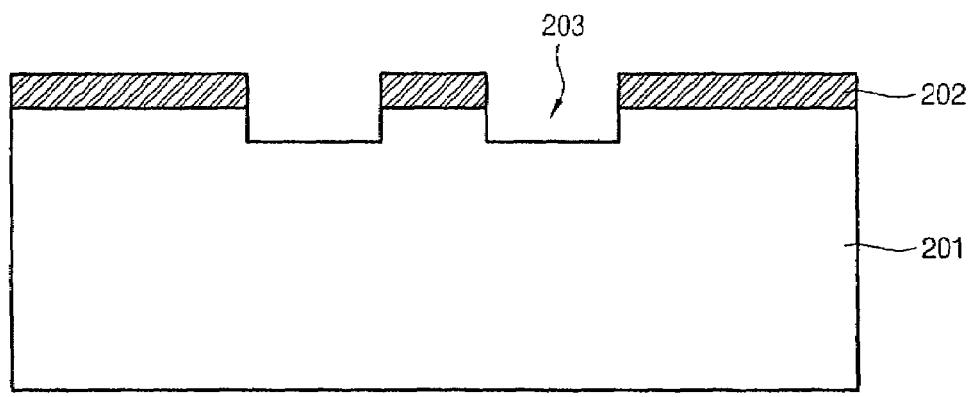
FIGS. 2A to 2F are cross-sectional views for illustrating processes of a method for forming a recess channel transistor according to an embodiment of the present invention, respectively.

Referring to FIG. 2A, after a semiconductor substrate 201 including an activation region and a device insulation region is prepared, a first etching mask 202 is formed on the substrate 201 in order to expose a gate forming region in the activation region of the substrate. The formation of the activation region and the device insulation region is explained below and will become clear with respect to FIG. 2C. The first etching mask 202 is preferably formed of a nitride layer, or, if necessary, a stacked layer of an oxide layer and the nitride layer. The first etching mask 202 is formed to have an opening width larger than the width of the recess gate to be formed. For example, the first etching mask 202 has the width of 100~1000 Å larger than the desired width of the recess gate. In addition, the first etching mask 202 is formed linearly.

Next, exposed portions of the substrate are etched at a depth of 100~300 Å by using the first etching mask 202, thereby forming first recesses 203 in the gate forming region of the activation region of the substrate.

Figure 2B:
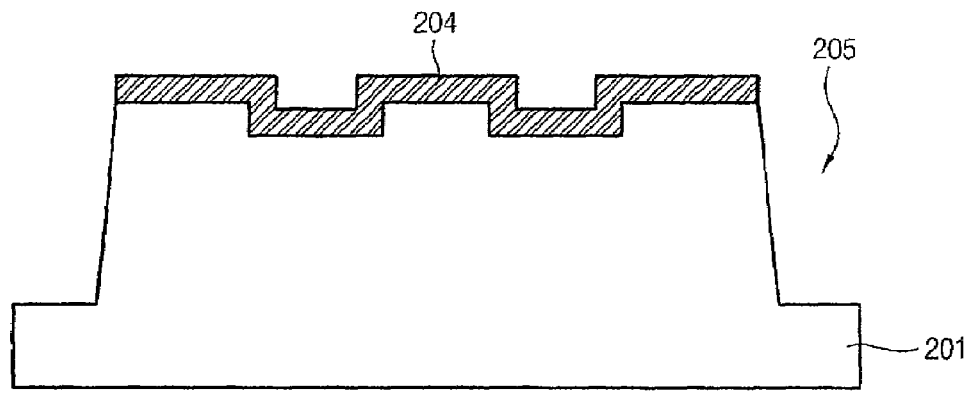

Referring to FIG. 2B, the first etching mask 202 is removed. Then, a second etching mask 204 is formed on a whole surface of the substrate including the first recesses 203 in order to cover the activation region but to expose the device insulation region. The second etching mask 204 is preferably formed of a nitride layer, or, if necessary, a stacked layer of an oxide layer and a nitride layer, like the first etching mask 202.

Next, the exposed device insulation region of the substrate is etched at a predetermined depth by using the second etching mask 204, so as to form trenches 205.

Figure 2C:
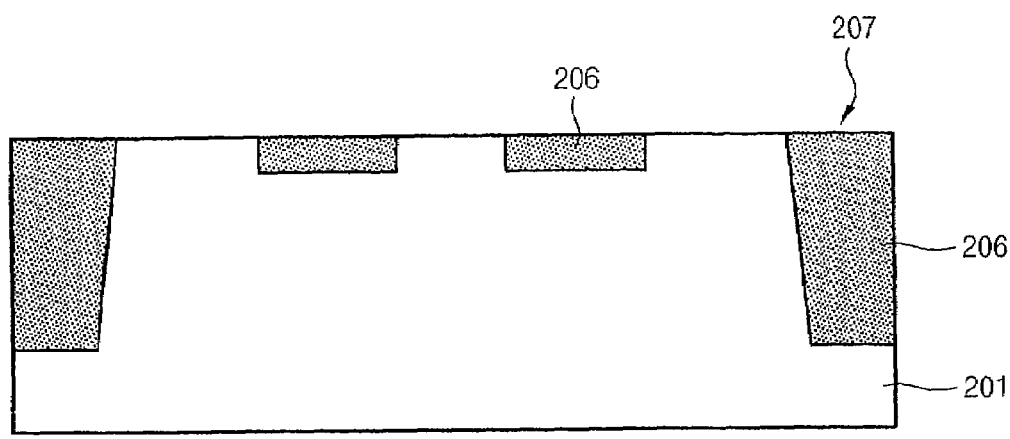

Referring to FIG. 2C, the second etching mask 204 is removed. After an insulation layer 206 is deposited on the whole surface of the substrate to fill in the trenches 205 and the first recesses 203, the surface of the substrate is flattened by a chemical mechanical polishing (CMP) method so that the device insulation layers 207 are formed in the trenches 205, respectively. The activation region is the area between the two insulation layers 207 shown in FIG. 2C. A nitride layer or a nitric oxide layer is used as the insulation layer 206.

Figure 2D:
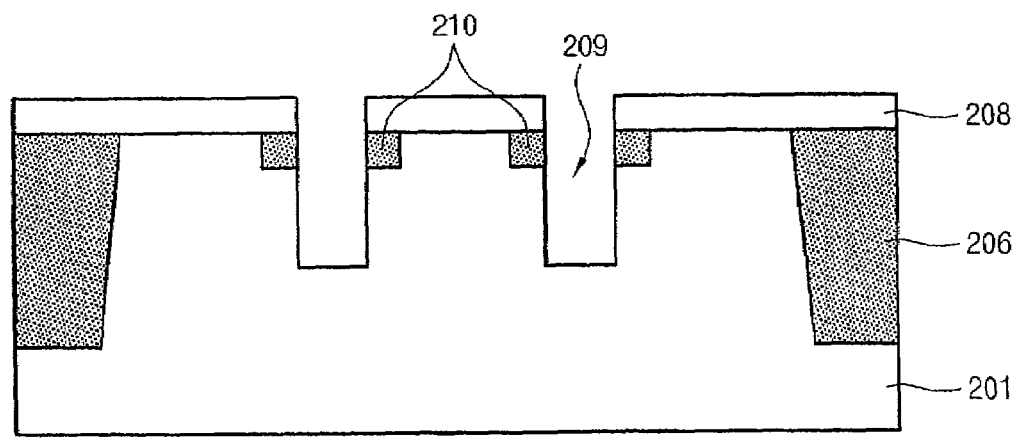

Referring to FIG. 2D, a third etching mask 208 is formed on the whole surface of the substrate in which the device insulation layer 207 is formed, while exposing the center portion of the insulation which fills in the first recesses 203. The third etching mask 208 is made of a photo-resist layer, specially, so as to have an opening width corresponding to the desired width of a recess gate.

Next, the exposed insulation layer is etched by using the third etching mask 208. In turn, the substrate is etched in order to form second recesses 209 and to form insulation buffer patterns 210 at both sides of an upper end of the second recesses 209 on and/or near the surface of the substrate. At this time, the second recesses 209 are formed at a total depth of 500~1000 Å by etching the substrate to a depth of 400~700 Å. The insulation buffer patterns 210 has a depth of 100~300 Å measured from the surface of the substrate 201 and a width of 50~500 Å measured from one sidewall to another sidewall of each second recess 209.

Figure 2E:
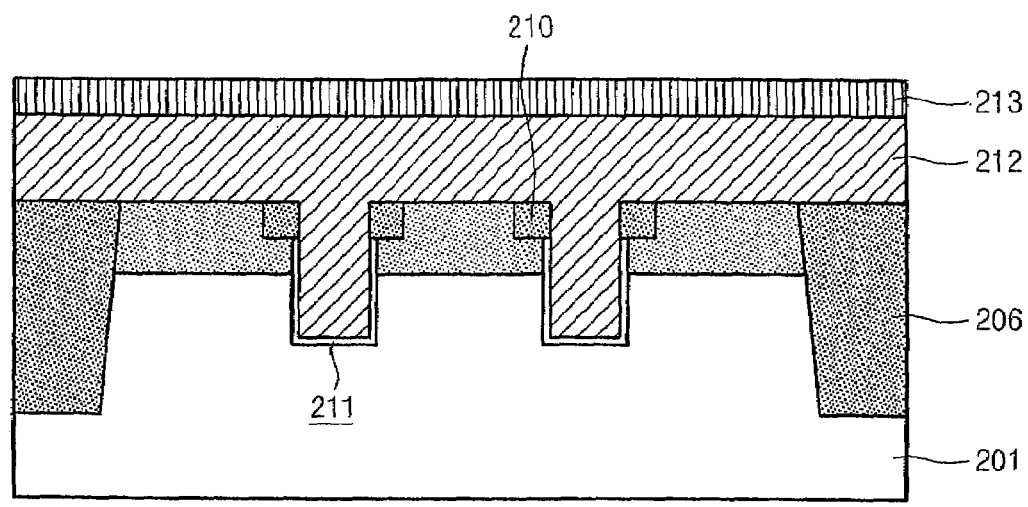

Referring to FIG. 2E, the third etching mask 208 is removed. Then, a gate insulation layer 211 is formed on the inner surface of each second recess 209 and the activation region of the substrate, excluding the device insulation layers 207 and the insulation buffer patterns 210. At this time, the gate insulation layer 211 is preferably converted into an oxide layer through a heat oxidation process. If necessary, the gate insulation layer 211 is converted into an oxide layer, a nitric oxide layer, or a stack layer of the oxide layer and the nitric layer.

After a gate conductive layer 212 is formed on the whole surface of the resultant of the substrate, so as to fill in the second recesses 209, the surface of the substrate is flattened. Then, a hard mask layer 213 of nitride material is formed on the gate conductive layer 212. A single layer of polysilicon layer is used as the gate conductive layer 212. If necessary, polysilicon layer and metal-based layer, i.e. metal silicide layer or a stacked layer of metal layers, may be used as the gate conductive layer. In a case where the stacked layer is used as the gate conductive layer 212, the polysilicon layer is formed to fully fill in the second recesses 209, while the metal silicide layer or the metal layer is formed on the polysilicon layer.

Figure 2F:
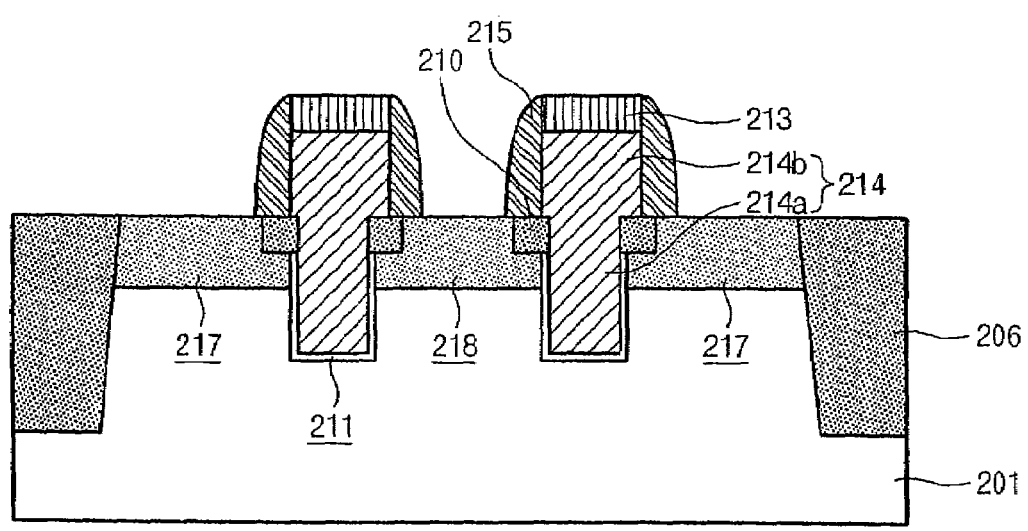

Referring to FIG. 2F, the hard mask layer 213, the gate conductive layer 212, and the gate insulation layer 211 are etched using a known process, so as to form recess gates 214a in the second recesses 209 respectively and to form a top gate 214b on each recess gate 214a, thereby forming gates 214 which have a stack structure and in which the top gate 214b is stacked on the recess gate 214a. With relation to the insulation buffer patterns 210 formed at both sides of the upper end of each second recess 209, even though misalignment of the top gate 214b with the recess gate 214a occurs, etching damage to the recess gates 214a is isolated by the insulation buffer patterns 210. This prevents the gate insulation layer 211 in a channel portion from becoming thicker during a sequent heat process, thereby protecting tREF/tWR characteristics against deterioration.

Next, Lightly Doped Drain (LDD) ion implant process is performed on the resultant of the substrate, so as to form LDD region (not shown) at both sides of each gate 214 on the surface of the substrate. After being formed on the resultant of the substrate, an insulation layer for spacers is blanket-etched so as to form a spacer 215 at both sidewalls of the gate 214 including the hard mask layer 213.

Thereafter, a source/drain ion implant process is performed on the resultant of the substrate, so as to form a source region 218 in contact with a storage node, and a drain region 217 in contact with a bit line at both sides of each gate 214 on the surface of the substrate. As a result, the formation of the recess channel transistor according to the present invention is accomplished.

In the recess channel transistor according to an embodiment of the present invention, the region where the dopant diffusion is weak can be geometrically removed in relation to the formation of the insulation buffer patterns at both sides of each recess gate on the surface of the substrate, so that even doping profile can be obtained in all the source and drain regions. Also, the difference in the threshold voltage between neighboring transistors can be improved.

Therefore, as recess channels according to this and other embodiments of the present invention are applied to the transistor, a data retention time in the transistor can extend and cell characteristics can be improved. Further, it can resolve a problem resulting from the misalignment of the top gate with the recess gate. As a result, it is possible to obtain the semiconductor memory device having excellent characteristics required for high integration memory device.

FIGS. 3A through 3F are cross-sectional views for illustrating a method for forming a recess channel transistor according to another embodiment of the present invention, in which processes are sequentially shown. The method for forming the recess channel transistor will be described below.

Figure 3A:
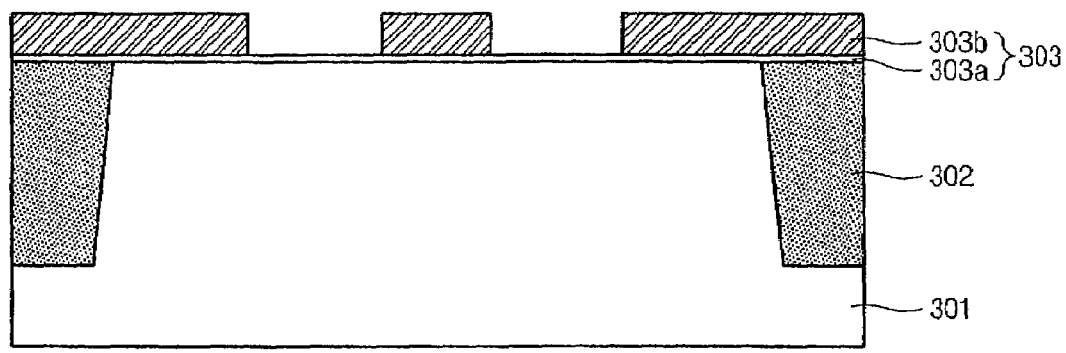
FIGS. 3A to 3F are cross-sectional views for illustrating processes of a method for forming a recess channel transistor according to another embodiment of the present invention, respectively.

Referring to FIG. 3A, a semiconductor substrate 301 is prepared which includes two trench type device insulation layers 302 defining an activation region therebetween. Then, after a buffer oxide layer 303a and a nitride layer 303b are sequentially formed on a whole surface of the substrate 301, including the device insulation layer 302, these layers 303a and 303b are etched in order to form a first etching mask 303, thereby exposing a gate forming region in the activation region of the substrate. At this time, the first etching mask 303 is formed so as to have an opening width larger than a width of the recess gate. For example, the first etching mask 303 is formed to have a width of 100~1000 Å larger than that of the recess gate.

Figure 3B:
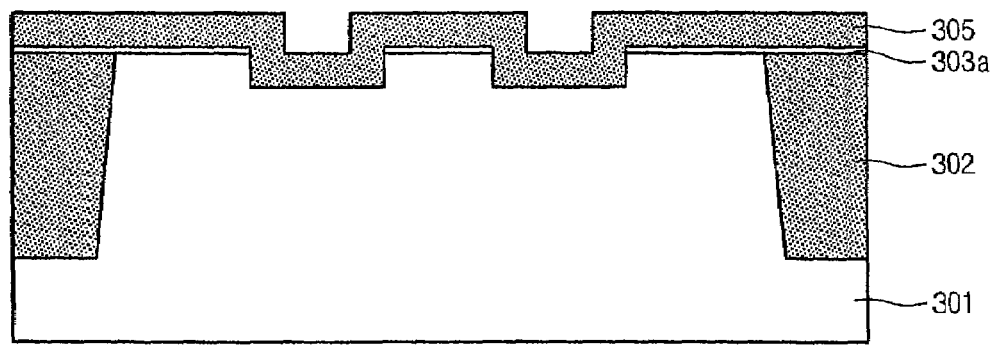

Referring to FIG. 3B, the exposed portions of the substrate 301 through the openings of the first etching mask 303 are etched to a predetermined depth, e.g., to a depth of 100~300 Å, by using the first etching mask 303, thereby forming first recesses 304 in the gate forming region of the activation region on the substrate 301.

Next, the nitride layer 303b acting as a mask is removed from the first etching mask 303. Then, an insulation layer 305 is deposited with an even thickness on the whole surface of the substrate including the first recesses 304 and the buffer oxide layer 303a. Here, a nitride layer or a nitric oxide layer is deposited with a thickness of 50~500 Å on the surfaces of the first recesses 304 and the buffer oxide layer 303 on the substrate 301, and the deposited nitride or nitric oxide layer is used as the insulation layer 305.

Figure 3C:
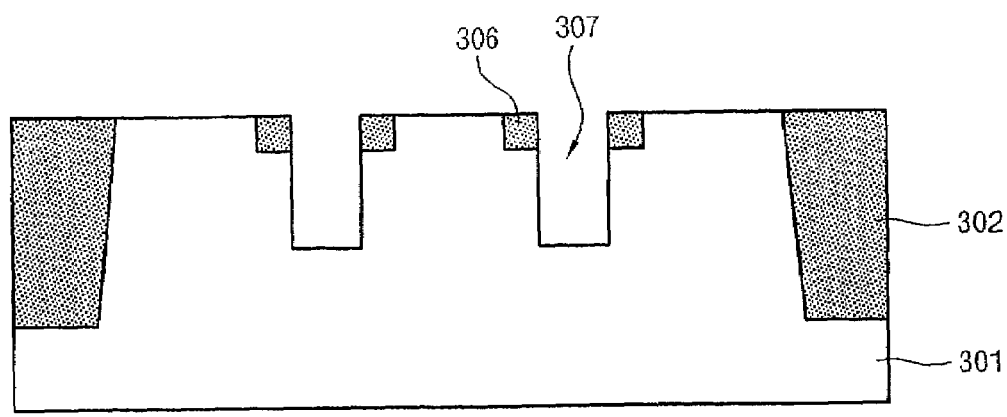

Referring to FIG. 3C, the insulation layer 305 is blanket-etched without the use of a mask in order to form an insulation buffer pattern 306 on both sidewalls of each first recess 304. Sequentially, a bottom surface of each first recess 304 between the insulation buffer patterns 306 is etched to form a second recess 307, which is deeper than the first recess.

Here, each of the insulation buffer patterns 306 has a thickness or depth of 100~300 Å measured from the surface of the substrate 301, and a width of 50~500 Å from one sidewall to another sidewall of each second recess 307. The second recess 307 is formed to have a total depth of 500~1000 Å by etching the substrate 301 at a depth of 400~700 Å.

On the other hand, during the blanket etching of the insulation layer 305, the buffer oxide layer 303a remaining on the surface of the substrate 301 is removed. If the buffer oxide layer 303a is not removed during the etching of the insulation layer 305, the buffer oxide layer 303a can be removed after completion of the process of etching the substrate.

Figure 3D:
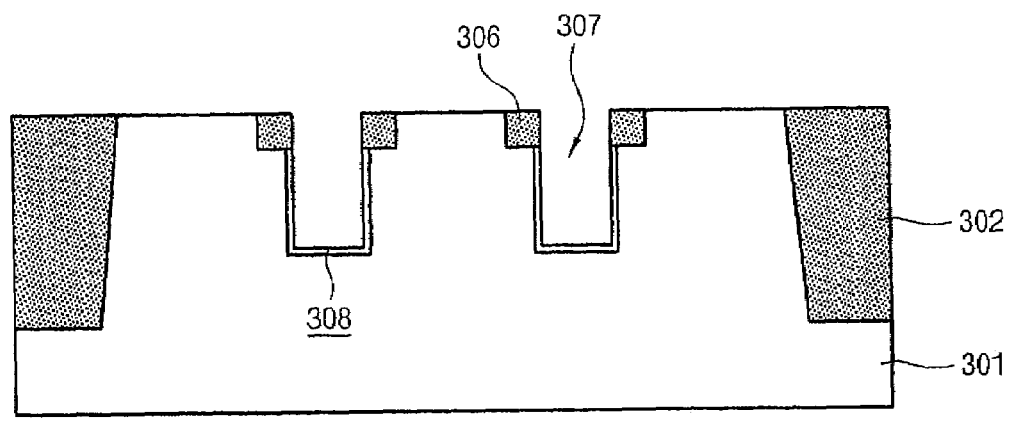

Referring to FIG. 3D, a gate insulation layer 308 is formed on the bottom surface and sidewalls of the second recess 307 but not on the surface of the insulation buffer patterns 306 inside the second recess 307.

Figure 3E:
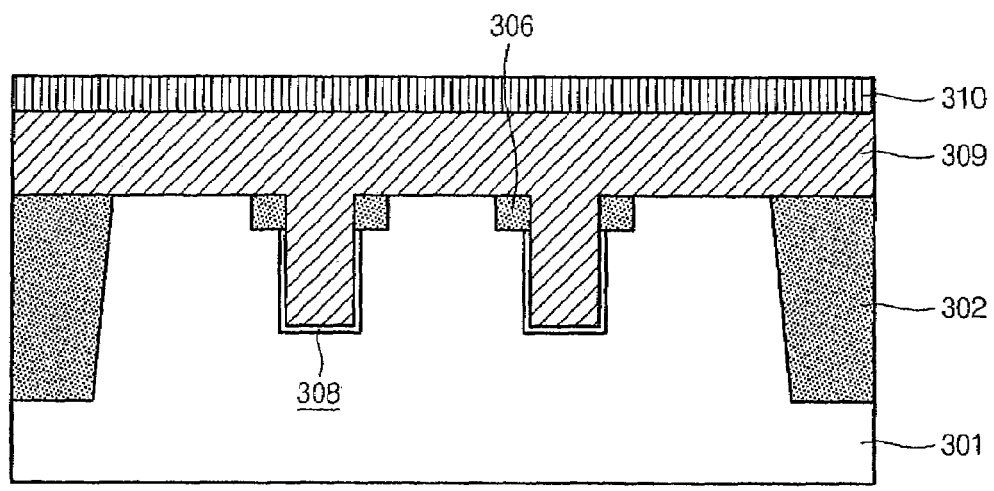

Referring to FIG. 3E, a gate conductive layer 309 is formed on the whole surface of the resultant structure remaining on the substrate 301 so as to fill the second recesses 308, and the surface of the gate conductive layer 309 is flattened. Thereafter, a hard mask layer 310 of nitride material is formed on the gate conductive layer 309. A single layer of polysilicon can be used as the gate conductive layer 309. If necessary, a stack layer of the polysilicon layer and a metal-based layer can be used as the gate conductive layer 309. In a case where the stack layer is used as the gate conductive layer 309, the polysilicon layer is form so as to fully fill in the second recesses 307, while a metal silicide layer or a metal layer is formed on the polysilicon layer.

Figure 3F:
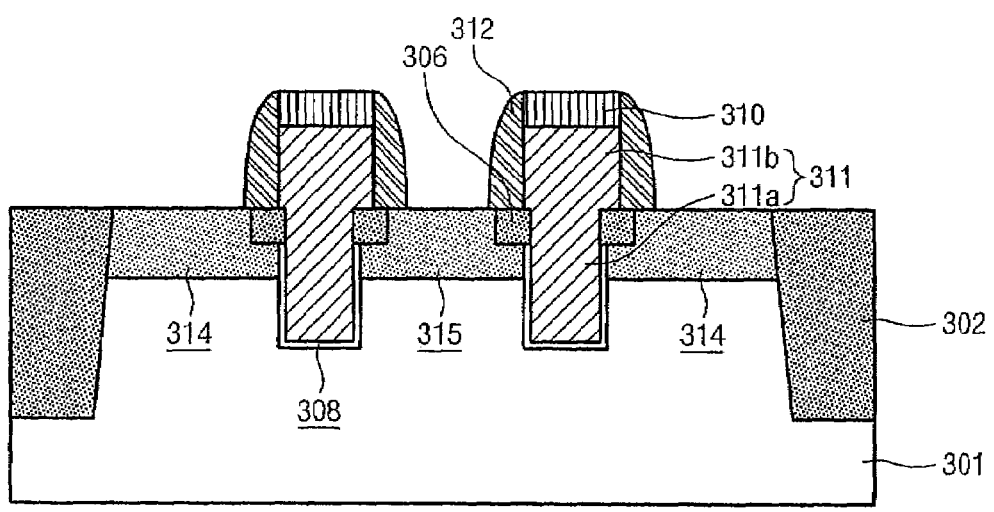

Referring to FIG. 3F, the hard mask layer 310, the gate conductive layer 309, and the gate insulation layer 308 are etched using a known process so as to form a recess gate 311a in each second recess 307 and to integrally form a top gate 311b on the recess gate 311a, thereby forming a gate 311 in a structure, in which the recess gate 311a and the top gate 311b are stacked. At this time, with relation to the insulation buffer pattern 306 formed at both sides of an upper end of each second recess 307, etching damages to the recess gate 311a can be isolated even though there occurs a misalignment of the top gate 311b with the recess gate 311a, like the previous embodiment of the present invention.

Next, after a LDD ion implant process is performed on the resultant of the substrate, an insulation layer as spacers is formed and blanket-etched so as to form spacers 312 on both side walls of the gate 311 including the hard mask layer 310. Thereafter, a source/drain ion implant process is performed on the resultant of the substrate so as to form a source region 313 in contact with a storage node and a drain region 314 in contact with a bit line at both sides of the gate 311 on the surface of the substrate. As a result, a formation of the recess channel transistor is accomplished according to the present invention.

The recess channel transistor in this embodiment of the present invention has the same characteristics as that of the previous embodiment.

As described above, according to various embodiments of the present invention, since the insulation buffer pattern is formed at both sides of the recess gate on the surface of the substrate, a doping profile can be uniform by such an insulation buffer pattern in the source and drain regions. Further, it is possible to protect the recess gate from etching damage caused due to the misalignment of the top gate with the recess gate and to prevent the gate insulation layer from abnormally growing due to the etching damage.

Thus, the present invention can form the transistor having excellent characteristics, e.g. low electric field and low junction leakage, and provide high integration semiconductor memory device.

While a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of forming a recess channel transistor in a semiconductor substrate having an activation region defined by adjoining device insulation regions, the method comprising the steps of:
   etching gate forming portions in the activation region, so as to form first recesses;
   etching the device insulation regions, so as to form trenches;
   filling each trench and each first recess with an insulation layer;
   etching a center portion of the insulation layer filled inside each first recess and continue etching the semiconductor substrate under the etched center portion of the insulation layer, so as to make second recesses that are deeper than the first recesses, wherein the unetched portions outside the etched center portion of the insulation layer remaining at near the opening of each second recess forms insulation buffer patterns;
   forming a gate insulation layer on an inner wall of each second recess, excluding the surface of the insulation buffer patterns;
   forming a gate conductive layer on the whole surface of the substrate having the second recesses and the insulation buffer patterns;
   etching the gate conductive layer, so as to form the gates such that each gate comprises a recess gate formed inside one second recess and a top gate formed on the recess gate;
   forming spacers at both sidewalls of each gate; and
   performing source/drain ion implant on the resultant of the substrate, so as to form a source region and a drain region at both sides of each gate in the substrate,
   wherein the source and drain regions have an even doping profile due to an existence of insulation buffer patterns.

2. The method of forming a recess channel transistor as claimed in claim 1, wherein each of the first recesses is formed at a depth of 100~300 Å measured from the surface of the semiconductor substrate.

3. The method of forming a recess channel transistor as claimed in claim 1, wherein each of the second recesses is formed at a depth of 500~1000 Å measured from the surface of the semiconductor substrate.

4. The method of forming a recess channel transistor as claimed in claim 1, wherein the insulation buffer patterns are formed of a nitride layer or a nitric oxide layer.

5. The method of forming a recess channel transistor as claimed in claim 1, wherein the insulation buffer patterns are formed to a depth of 100~300 Å measured from the surface of the substrate.

6. The method of forming a recess channel transistor as claimed in claim 1, wherein each insulation buffer pattern is formed to a width of 50~500 Å measured from the inner surface of the second recess.

7. The method of forming a recess channel transistor as claimed in claim 1, the step of etching the gate conductive layer comprising the substep of:
   forming a hard mask layer on the gate conductive layer prior to etching.

8. A method of forming a recess channel transistor in a semiconductor substrate having an activation region defined by adjoining device insulation regions, the method comprising the steps of:
   etching gate forming portions in the activation region, so as to form first recesses;
   forming an insulation layer on the entire surface of the substrate including the first recesses;
   blanket etching the insulation layer, so as to form insulation buffer patterns on the sidewalls of each first recess;
   etching a bottom surface of each first recess exposed between the insulation buffer patterns, so as to make a second recess deeper than the first recess;
   forming a gate insulation layer on the surface of each of the second recesses, excluding the surface of the insulation buffer patterns;
   forming a gate conductive layer on the entire surface of the substrate having the second recesses and insulation buffer patterns formed thereon, so that the second recesses including the gate insulation layer are filled with the gate conductive layer;
   etching the gate conductive layer, so as to form the gates such that each gate comprises a recess gate formed inside one second recess and a top gate formed on the recess gate;
   forming spacers at both sidewalls of the gates; and
   performing source/drain ion implant on the resultant of the substrate, so as to form source and drain regions at both sides of each gate in the substrate,
   wherein the source and drain regions have an even doping profile due to the existence of insulation buffer patterns.

9. The method of forming a recess channel transistor as claimed in claim 8, wherein each of the first recesses is formed to a depth of 100~300 Å measured from the surface of the substrate.

10. The method of forming a recess channel transistor as claimed in claim 8, wherein the insulation buffer patterns are formed of a nitride layer or a nitric oxide layer.

11. The method of forming a recess channel transistor as claimed in claim 8, wherein each of the insulation buffer patterns is formed to a depth of 100~300 Å measured from the surface of the substrate.

12. The method of forming a recess channel transistor as claimed in claim 8, wherein each of the insulation buffer patterns is formed to a width of 50~500 Å measured from the inner surface of the second recesses.

13. The method of forming a recess channel transistor as claimed in claim 8, wherein each of the second recesses is formed to a depth of 500~1000 Å measured from the surface of the substrate.

14. The method of forming a recess channel transistor as claimed in claim 8, the step of etching the gate conductive layer comprising the substep of:
   forming a hard mask layer on the gate conductive layer prior to etching.

\* \* \* \* \*